United States Patent
Dempsey

(10) Patent No.: US 9,124,296 B2
(45) Date of Patent: Sep. 1, 2015

(54) MULTI-STAGE STRING DAC

(71) Applicant: Dennis A. Dempsey, Newport (IE)

(72) Inventor: Dennis A. Dempsey, Newport (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 13/841,516

(22) Filed: Mar. 15, 2013

(65) Prior Publication Data

US 2014/0002289 A1    Jan. 2, 2014

Related U.S. Application Data

(60) Provisional application No. 61/664,966, filed on Jun. 27, 2012, provisional application No. 61/726,431, filed on Nov. 14, 2012.

(51) Int. Cl.
| | |
|---|---|
| H03M 1/78 | (2006.01) |
| H03M 1/66 | (2006.01) |
| H03M 1/10 | (2006.01) |
| H03M 1/68 | (2006.01) |
| H03M 1/76 | (2006.01) |

(52) U.S. Cl.
CPC .............. *H03M 1/66* (2013.01); *H03M 1/1061* (2013.01); *H03M 1/682* (2013.01); *H03M 1/765* (2013.01)

(58) Field of Classification Search
CPC ... H03M 1/785; H03M 1/808; H03M 1/0607; H03M 1/46; H03M 1/66
USPC ......................................... 341/144, 145, 154
See application file for complete search history.

(56) References Cited

U.S. PATENT DOCUMENTS

| | | |
|---|---|---|
| 3,755,807 A | 8/1973 | Brown |
| 4,338,591 A | 7/1982 | Tuthill |
| 4,491,825 A | 1/1985 | Tuthill |
| 4,543,560 A | 9/1985 | Holloway |
| 4,638,303 A | 1/1987 | Masuda et al. |
| 4,918,448 A * | 4/1990 | Hauviller et al. ............. 341/145 |
| 5,075,677 A | 12/1991 | Meaney et al. |
| 5,554,986 A | 9/1996 | Neidorff |
| 5,568,147 A * | 10/1996 | Matsuda et al. ............. 341/154 |
| 5,739,782 A | 4/1998 | Uda |
| 5,764,174 A | 6/1998 | Dempsey et al. |
| 5,831,566 A | 11/1998 | Ginetti |
| 5,877,717 A | 3/1999 | Tu et al. |
| 5,940,020 A | 8/1999 | Ho |
| 5,969,657 A | 10/1999 | Dempsey et al. |
| 6,037,889 A * | 3/2000 | Knee ............................. 341/154 |
| 6,191,720 B1 | 2/2001 | Zhang |
| 6,297,759 B1 * | 10/2001 | Lewyn .......................... 341/150 |
| 6,346,908 B1 | 2/2002 | Jones, III |

(Continued)

*Primary Examiner* — Linh Nguyen
(74) *Attorney, Agent, or Firm* — Kenyon & Kenyon LLP

(57) ABSTRACT

Embodiments of the present invention may provide string DAC architecture with multiple stages for efficient resolution extension. A first stage may include an impedance string (e.g., resistor string). A second stage may include a switch network with each switch having more than two states (impedance values). A third stage may include a string DAC with an impedance string with a set of corresponding switches. In multi-channel embodiments, multiple second and third stages may be provided for each channel while sharing the same first stage (i.e., impedance string). Each second stage switch networks may be controlled based on the relationship between the different channels such as MSB values. Thus, the second stage switch networks may provide different impedance values to compensate for loading effects in multi-channel, multi-stage string DAC designs.

28 Claims, 8 Drawing Sheets

(56) References Cited

U.S. PATENT DOCUMENTS

| | | | |
|---|---|---|---|
| 6,486,817 B1 * | 11/2002 | Okada et al. | 341/154 |
| 6,535,154 B1 | 3/2003 | Sculley | |
| 6,549,196 B1 | 4/2003 | Taguchi et al. | |
| 6,567,026 B1 * | 5/2003 | Gorman | 341/154 |
| 6,885,328 B1 * | 4/2005 | Kao et al. | 341/144 |
| 6,914,547 B1 | 7/2005 | Swaroop et al. | |
| 6,958,720 B1 * | 10/2005 | Prater | 341/145 |
| 7,136,002 B2 | 11/2006 | Dempsey et al. | |
| 7,330,143 B2 | 2/2008 | Kim et al. | |
| 7,342,527 B2 * | 3/2008 | Tsuchi | 341/144 |
| 7,365,670 B2 * | 4/2008 | Lan | 341/145 |
| 7,420,496 B2 * | 9/2008 | Kim et al. | 341/145 |
| 7,425,912 B2 | 9/2008 | Cosgrave | |
| 7,474,245 B1 | 1/2009 | Wang et al. | |
| 7,639,166 B2 | 12/2009 | Iijima | |
| 7,767,953 B2 * | 8/2010 | Yamaoka | 250/214 R |
| 7,889,106 B2 | 2/2011 | Imai | |
| 7,956,786 B2 | 6/2011 | Cosgrave | |
| 7,978,089 B2 * | 7/2011 | Salgueiro et al. | 340/650 |
| 8,766,841 B2 * | 7/2014 | Mallinson | 341/153 |
| 2002/0145552 A1 * | 10/2002 | Gorman | 341/145 |
| 2003/0048830 A1 | 3/2003 | Dickerman et al. | |
| 2003/0141998 A1 | 7/2003 | Matsui | |
| 2006/0103564 A1 * | 5/2006 | Haurie et al. | 341/144 |
| 2006/0145904 A1 | 7/2006 | Kim | |
| 2007/0152860 A1 | 7/2007 | Jain | |
| 2007/0296618 A1 | 12/2007 | Cosgrave et al. | |
| 2008/0180295 A1 | 7/2008 | Lan | |
| 2009/0207059 A1 | 8/2009 | Wikner | |
| 2010/0182175 A1 | 7/2010 | Oo et al. | |
| 2010/0245145 A1 | 9/2010 | Motamed | |
| 2011/0102227 A1 * | 5/2011 | Motamed | 341/154 |
| 2012/0049917 A1 | 3/2012 | Cook | |
| 2012/0146828 A1 | 6/2012 | Narathong et al. | |
| 2012/0326907 A1 | 12/2012 | Hirai | |
| 2013/0076549 A1 | 3/2013 | Bajdechi et al. | |

* cited by examiner

100

100

200

300

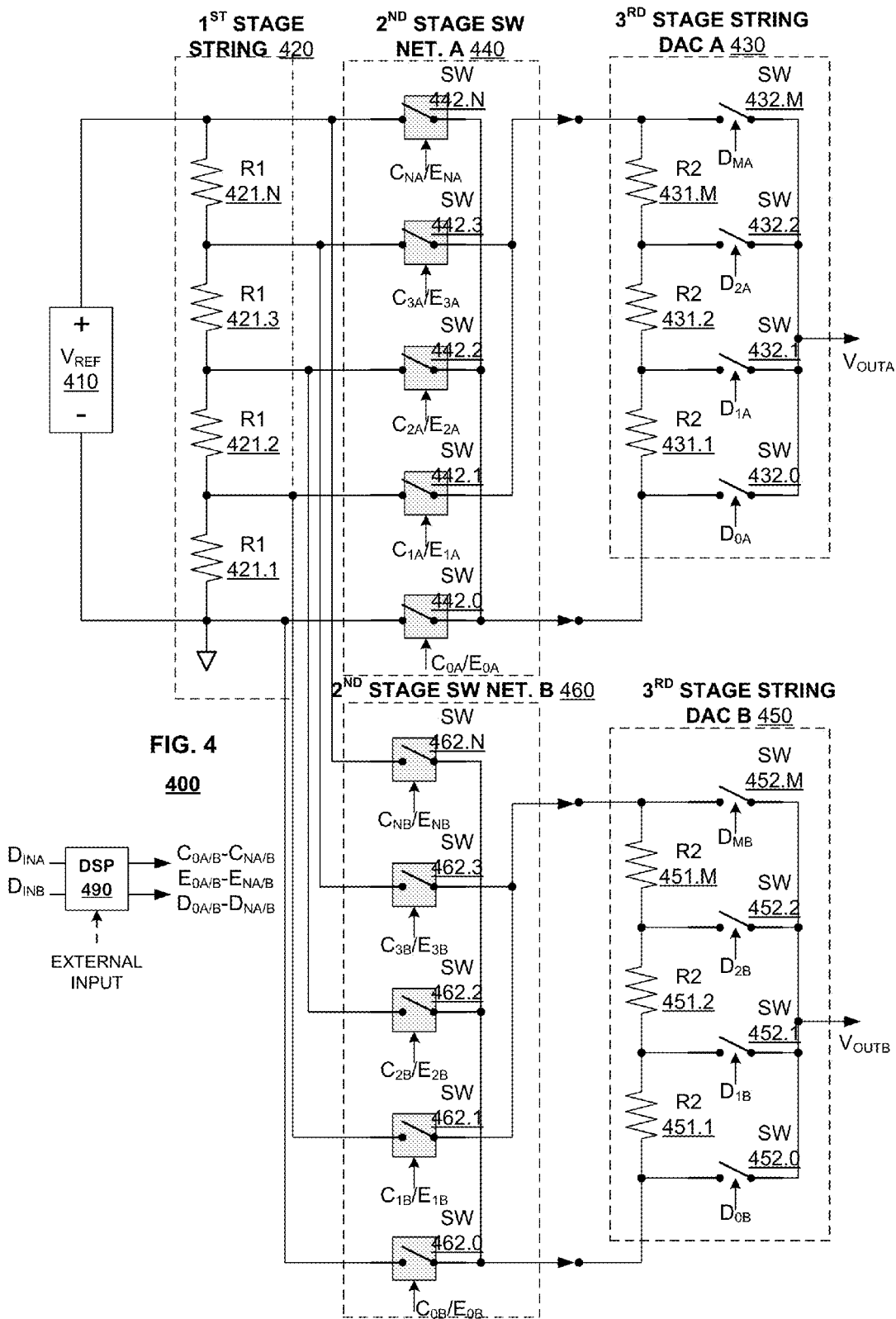

Case 1: DAC2 > DAC1    Case 2: DAC2 = DAC1    Case 3: DAC2 < DAC1

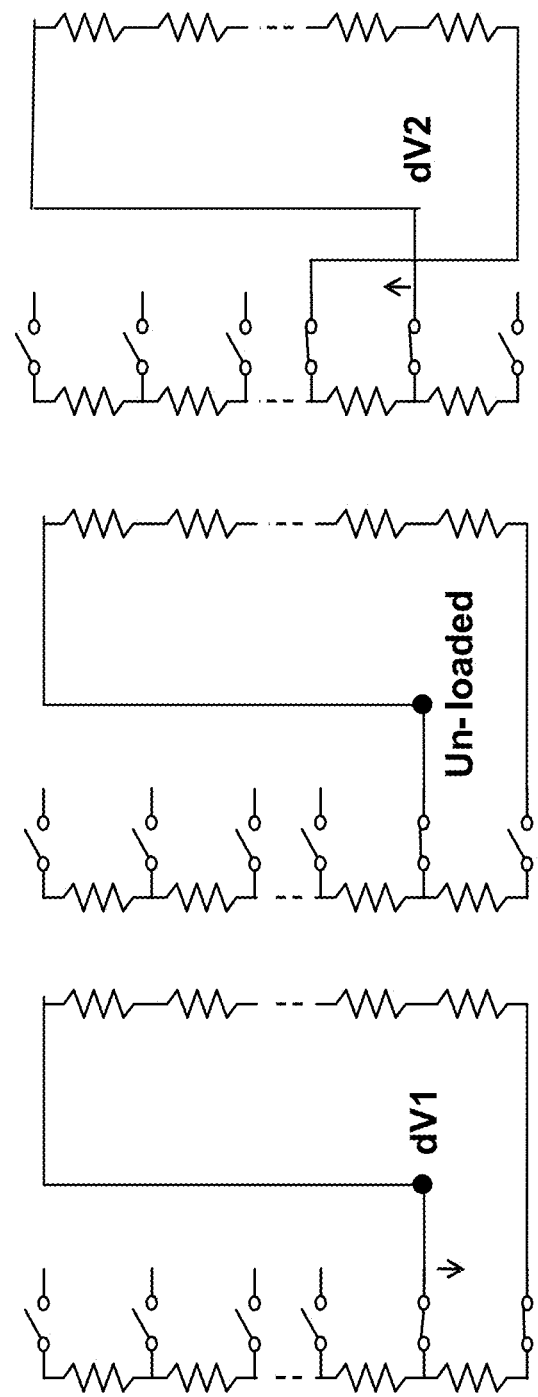

900

1000

MULTI-STAGE STRING DAC

CROSS-REFERENCE TO RELATED APPLICATIONS

This application claims the benefit of priority afforded by provisional U.S. Patent Application Ser. No. 61/664,966, filed Jun. 27, 2012, and provisional U.S. Patent Application Ser. No. 61/726,431, filed Nov. 14, 2012, the contents of which are incorporated herein.

BACKGROUND

The present invention relates to string digital-to-analog converters (DACs), in particular, to a multi-stage string DAC architecture that may be used in single channel and multi-channel systems.

DACs convert a digital word into a corresponding analog signal. Dual string DACs, a type of DAC, are oftentimes used because of their higher resolution properties that increase dynamic range while reducing truncation noise. FIG. 1(a) shows a simplified block diagram of a conventional dual string DAC 100. The dual string DAC 100 includes two DACs, an MSB String DAC 120 and an LSB String DAC 130, which both include series-connected impedance strings, such as resistor strings. The MSB String DAC 120 typically converts the most significant bits (MSBs) of the digital word, and its output is coupled to the LSB String DAC 130, which converts the least significant bits (LSBs) of the digital word. $V_{OUT}$ represents the converted analog signal.

FIG. 1(b) shows a circuit implementation of the conventional dual string DAC 100. As shown, each string DAC 120, 130 include a resistor string 121.1-121.N, 131.1-131.M coupled to respective switch sets 122.0-122.N, 132.0-132.M that are operated according to digital word based control signals, $C_0$-$C_N$ and $D_0$-$D_M$. Also, the switches in switch sets 122.0-122.N, 132.0-132.M generally include only two states—on or off.

The dual string DAC 100, however, is a single channel DAC. To convert a conventional dual string DAC to a multi-channel system, multiple, separate DAC blocks are provided. Alternatively, the MSB DAC can be shared by multiple sub LSB DACs, but buffers are generally needed in between the MSB DAC and each sub LSB DAC to counter loading effects. Typically, two buffers are need per sub-string (i.e., per channel).

The buffers though limit the common-mode range of operation. Also, buffers limit rail-to-rail operation and add extra noise into the conversion. In addition, buffers (or amplifiers) are sources for errors such as nonlinearities due to offset voltages while also taking up large amounts of circuit board space. As such, the use of buffers oftentimes provides more drawbacks than advantages.

Therefore, the inventor recognized a need in the art for string DAC architecture that provides higher resolution while reducing component count and that also compensates for loading effects without using buffers, which can be used in single channel systems and multi-channel systems.

BRIEF DESCRIPTION OF THE DRAWINGS

FIG. 4 illustrates a circuit implementation of a multi-channel string DAC according to an embodiment of the present invention.

FIG. 6 illustrates LSB DAC loading effects in a three-state transition DAC configuration.

DETAILED DESCRIPTION

Embodiments of the present invention may provide a string digital-to-analog converter (DAC). The string DAC may include a first impedance string; a switch network coupled to the first impedance string, at least one switch in the switch network having more than two states; and a second impedance string coupled to the switch network.

Embodiments of the present invention may provide a multi-channel string DAC. The multi-channel string DAC may include a first string corresponding to respective first portions of digital words; a plurality of switch networks, each switch network associated with a respective channel and coupled to the first string, wherein at least one switch in each switch network has more than two states; and a plurality of channel strings, each channel string is coupled to a respective switch network and including an output terminal to output a converted analog signal for the respective channel.

Embodiments of the present invention may provide a method of converting multiple digital words into respective analog voltages in separate channels. The method may include receiving the multiple digital words; applying a reference voltage to a shared string; coupling multiple sets of switches to different nodes in the shared string based on first portions of the multiple digital words; configuring impedance values of the coupled switches based on a relationship between the first portions of the multiple digital words; coupling outputs of the multiple sets of switches to channel strings; and outputting the respective analog voltages.

Embodiments of the present may provide a multi-channel DAC. The multi-channel DAC may include a first stage resistor string; a plurality of second stage resistor strings, each associated with a respective channel; and a plurality of switch networks, each having switches to connect intermediate nodes of the first stage resistor string to end points of a respective second stage resistor string. The switches of the switch networks have multiple conductive states.

Figure 1A:
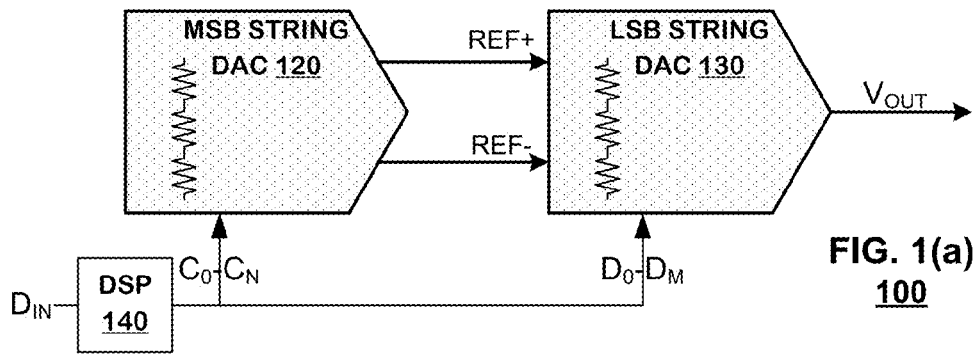
FIG. 1(a) illustrates a conventional dual string DAC.
Figure 1B:
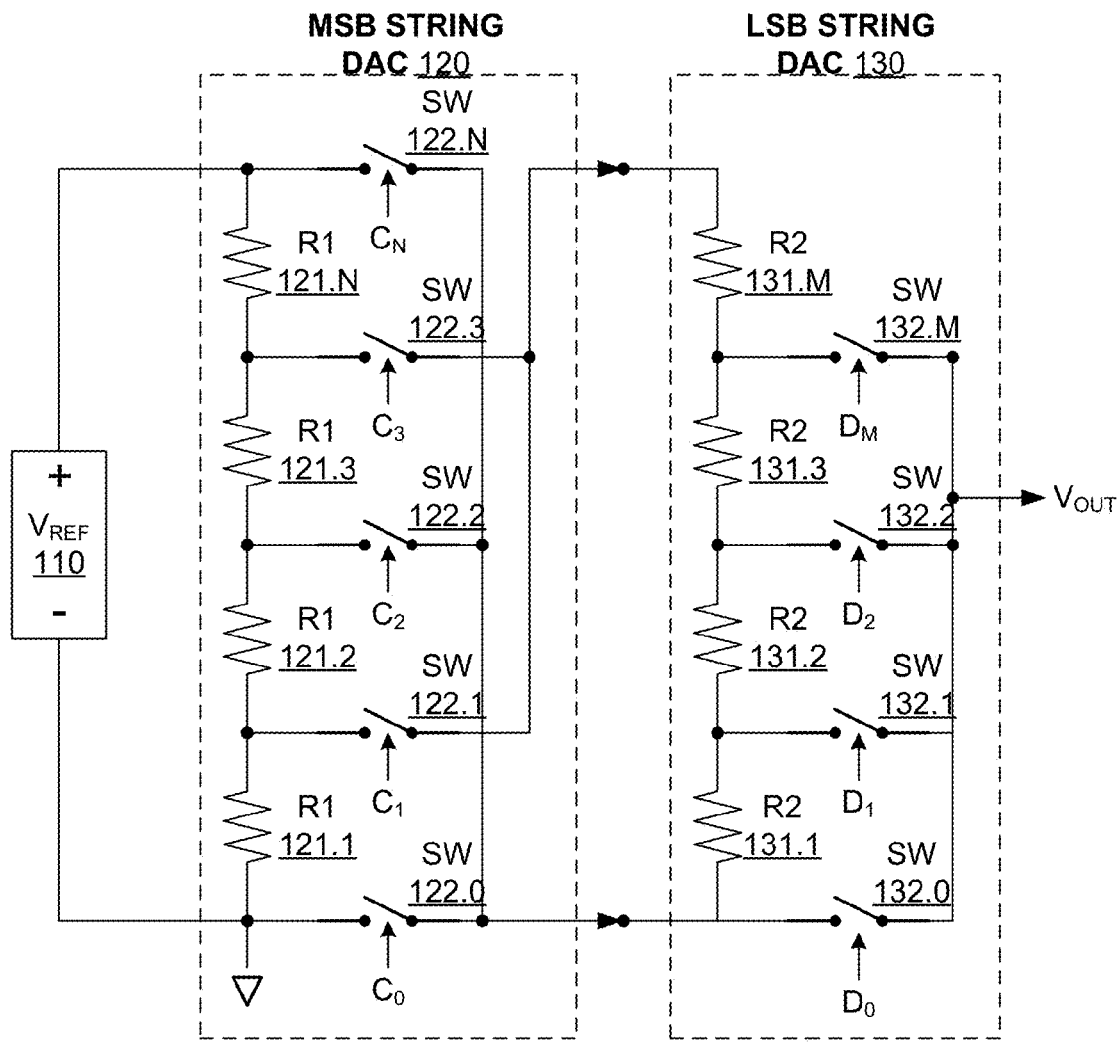
FIG. 1(b) illustrates a circuit implementation of a conventional dual string DAC.
Figure 2:
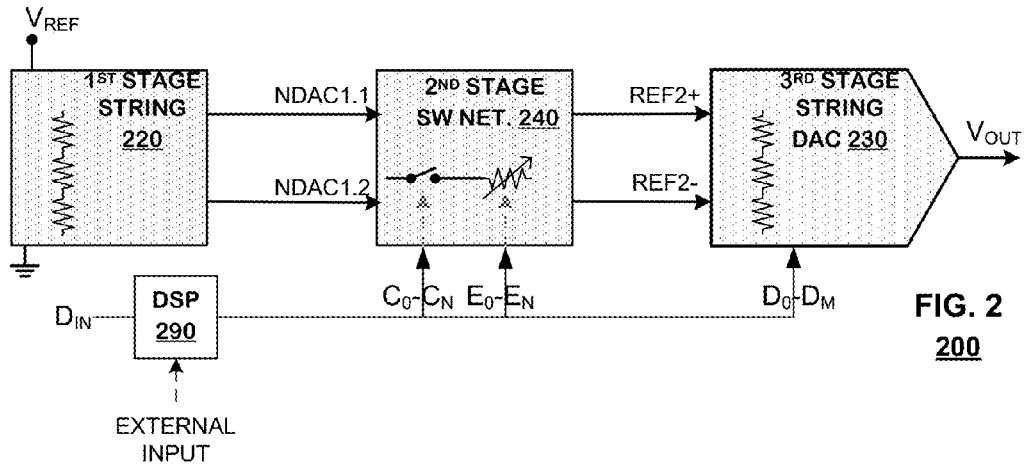
FIG. 2 illustrates a string DAC according to an embodiment of the present invention.

FIG. 2 is a string DAC 200 with three stages according to an embodiment of the present invention. The string DAC 200 may include a 1$^{st}$ stage string 220, a 2$^{nd}$ stage switch network 240, a third stage string DAC 230, and a digital signal processor (DSP) 290. The string DAC 200 may convert input digital word $D_{IN}$ into a converted analog voltage $V_{OUT}$.

The 1st stage string 220 may provide a reference voltage at different levels via an impedance string. In an embodiment, the 1st stage string 220 may be implemented as a resistor string or other impedance structures such as MOS devices. For example, the 1st stage string 220 may include series coupled resistors (i.e., a resistor string) and an input for the reference voltage to be applied. The resistors may correspond to the MSB positions of a digital word to be converted and may operate as a voltage divider for a reference voltage $V_{REF}$. Hence, output of the 1st stage string 220 may be provided as NDAC1.1 and NDAC1.2, which may represent 1st stage string 220 output terminals. The 1st stage string 220 may also have a unique resolution (RES) associated therewith (say, RES1). For example, the number of resistors in the 1st stage string 220 may be indicative of the resolution. In an embodiment, the number of resistors may be expressed as N_Resistors=$2^{RES}$. Therefore, a resolution, RES, of 6b would yield 64 resistors ($2^6$). Hence, the number of resistors increases exponentially with resolution. Moreover, a binary resolution DAC embodiment is described here for illustration purposes, and other numeric bases and non-binary number of states configurations may also be implemented.

A 2nd stage switch network 240 may provide multiple state switches to convert the MSBs and LSBs of the digital word. The 2nd stage switch network 240 may be coupled to the 1st stage string DAC's 220 output terminals (NDAC1.1 and NDAC1.2). The 2nd stage switch network 240 may include a switching network with each switch in the switching network having more than two states. The states may include an off position and a plurality of on positions with differing impedance values. In an embodiment, the switches, for example, may include multiple states such as an off position, an on position with high impedance, an on position with medium impedance, and an on position with low impedance. The 2nd stage switch network 240 switches may be selectively coupled to the resistors in the 1st stage string 220 to divide the reference voltage corresponding to the MSBs. The 2nd stage switch network 240 may also have a unique resolution associated therewith (say, RES2).

The 3rd stage string DAC 230 may convert the "middle" bits (i.e., bits between the MSBs and the LSBs) of the digital word to generate the converted analog signal output. Note, unlike conventional string DACs, the last stage in this embodiment may convert the middle bits where in conventional DACs, the last stage (say, LSB Sting DAC 130) generally converted the LSBs of the digital word. The 3rd stage string DAC 230 may be coupled to the output of the 2nd stage switch network 240 (REF2+ AND REF2−). The 3rd stage string DAC 230 may include an impedance string (e.g., a resistor string or MOS device string) and switches, which are controlled according to the middle bit positions. The output of the 3rd stage string DAC 230 may be $V_{OUT}$, which is the converted analog signal. The 3rd stage string DAC 230 may also have a unique resolution associated therewith (say, RES3).

The DSP 290 may be coupled to different stages in the string DAC 200, for example the 2nd stage switch network 240 and the 3rd stage string DAC 230. The DSP 290 may generate control signals to control operations of the stages based on the input digital word. The DSP may generate control signals $C_0$-$C_N$ and $E_0$-$E_N$ based on the MSBs and LSBs of the digital word and may generate control signals $D_0$-$D_M$ based on the middle bits of the digital words. Further, control signals $C_0$-$C_N$ may control whether the corresponding switch is open or closed in the 2nd stage switch network. 240, and control signals $E_0$-$E_N$ may control which impedance state (e.g., high, medium, or low) is selected. In an embodiment, operations of the control signals may be integrated into one set of control signals that control open/closed switch positions as well as impedance state values. Control signals $D_0$-$D_M$ may control whether the corresponding switch is open or closed in the 3rd stage string DAC 230. Moreover, the control signals may be inter-dependent as explained in further detail below.

The string DAC 200 may include three stages as described above to provide new and efficient resolution extension. The resolution of the string DAC 200 may be the sum of the resolution of each individual stage (say, RES1+RES2+RES3). Thus, string DAC 200 may provide better resolution extension than conventional dual string DACs, which typically require expanding the number of resistors in the strings for resolution extension. As noted, in a conventional DAC the number of resistors increases exponentially with resolution. Although the number of resistors may still increase with increasing impedance string resolution in the string DAC 200 embodiment, the new variable 2nd stage switch network 240 provides additional resolution enhancement in the overall string DAC 200 while enabling resolution reduction of the string(s) sub-parts of the string DAC 200. Therefore, multi-stage DACs as described herein provide significant advantages in moderate-to-high resolution DAC systems especially in low power DAC applications.

Moreover, the string DAC 200 of FIG. 2 is a single channel implementation. However, the staged technique of the string DAC 200 may allow for expansion to multi-channel embodiments.

Figure 3:
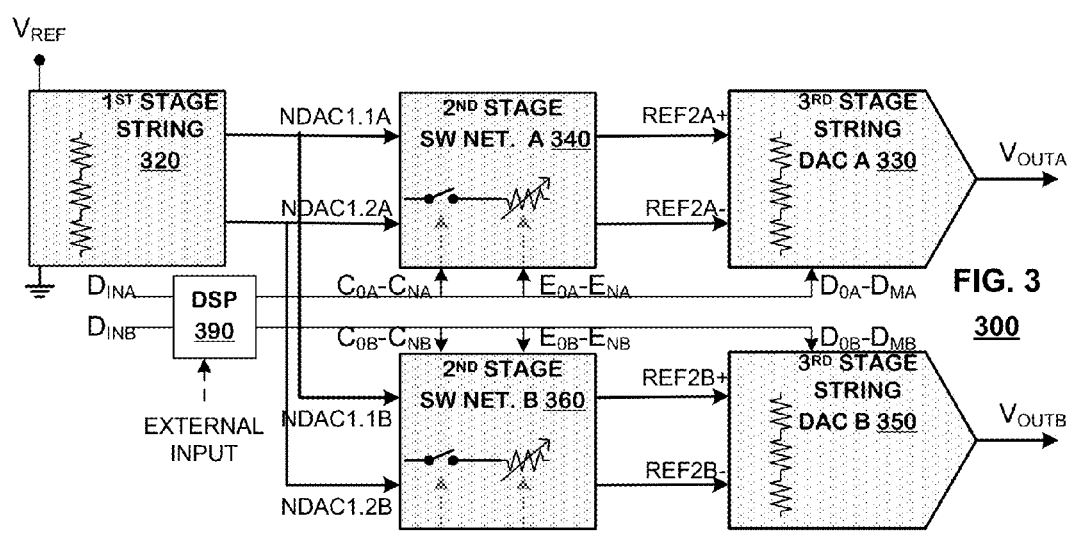
FIG. 3 illustrates a multi-channel string DAC according to an embodiment of the present invention.

FIG. 3 is a multi-channel string DAC 300 according to an embodiment of the present invention. The multi-channel string DAC 300 is described here with two channels (channel A and channel B); however, the multi-channel string DAC 300 may be expanded to any number of channels. The multi-channel string DAC 300 may include a 1st stage string 320, a 2nd stage switch network A 340, a 3rd stage string DAC A 330, a 2nd stage switch network B 360, a 3rd stage string DAC B 350, and a DSP 390. The multi-channel string DAC 300 may convert input digital word $D_{INA}$ into a converted analog voltage $V_{OUTA}$ for channel A and may convert input digital word $D_{INB}$ into a converted analog voltage $V_{OUTB}$ for channel B. The channel A and B conversions may be performed in parallel. As explained below, channel conversions may be inter-dependent on each other and channel configurations may be modified based on the interaction with other channel(s).

A reference voltage may be provided to the 1st stage string 320 to divide the reference voltage to different levels via an impedance string, which may be shared by multiple channels. The reference voltage may be provided by a voltage source or other active circuitry that generates voltage. In an embodiment, the 1st stage string 320 may include series coupled resistors (i.e., a resistor string) or other impedance structures such as MOS devices. For example, the resistors may correspond to the MSB positions of the digital word to be converted and may operate as a voltage divider for a reference voltage $V_{REF}$. Hence, the output terminals of the 1st stage string 320 may be provided as NDAC1.1 and NDAC1.2. The 1st stage string 320 may be shared by multiple channels.

The 2nd stage switch network A 340 may provide multiple state switches to convert the MSBs and LSBs of the digital word of channel A. The 2nd stage SW switch network A 340 may be coupled to nodes corresponding to the 1st stage string DAC's 320 output terminals, NDAC1.1A and NDAC1.2A, for channel A. The 2nd stage switch network 340 may include a switching network with each switch in the switching network having more than two states. The states may include an off position and a plurality of on positions with differing impedance values. In an embodiment, the switches, for example, may include multiple states such as an off position, an on position with high impedance, an on position with medium impedance, and an on position with low impedance. The $2^{nd}$ stage switch network A 340 switches may be selectively coupled to the resistors in the $1^{st}$ stage string 320 to divide the reference voltage corresponding to the MSBs for channel A.

The $3^{rd}$ stage string DAC A 330 may convert the middle bits of the digital word to generate the converted analog signal output of channel A. The $3^{rd}$ stage string DAC A 330 may be coupled to the output of the $2^{nd}$ stage switch network A 340. The $3^{rd}$ stage string DAC A 330 may include serially coupled impedance elements (e.g., a resistor string or MOS device string) and switches, which are controlled according to the middle bits of channel A. The output of the $3^{rd}$ stage string DAC A 330 may be $V_{OUTA}$, which is the converted analog signal of channel A.

The $2^{nd}$ stage switch network B 360 may provide multiple state switches to convert the MSBs and LSBs of the digital word of channel B. The $2^{nd}$ stage switch network B 360 may be coupled to the $1^{st}$ stage string DAC's 320 output terminals, NDAC1.1B and NDAC1.2B, for channel B. The $2^{nd}$ stage switch network B 360 may include a switching network with each switch in the switching network having more than two states. The states may include an off position and a plurality of on positions with differing impedance values. In an embodiment, the switches, for example, may include multiple states such as an off position, an on position with high impedance, an on position with medium impedance, and an on position with low impedance. The $2^{nd}$ stage switch network B 360 switches may be associated with the resistors in the $1^{st}$ stage string DAC 320 to divide the reference voltage corresponding to the MSBs for channel B.

The $3^{rd}$ stage string DAC B 350 may convert the middle bits of the digital word to generate the converted analog signal output of channel B. The $3^{rd}$ stage string DAC B 350 may be coupled to the output of the $2^{nd}$ stage switch network B 360. The $3^{rd}$ stage string DAC B 350 may include serially coupled impedance elements (e.g., a resistor string or MOS device string) and switches, which are controlled according to the middle bits of channel B. The output of the $3^{rd}$ stage string DAC B 350 may be $V_{OUTB}$, which is the converted analog signal of channel B.

The DSP 390 may be coupled to different stages, for example the $2^{nd}$ stage switch networks 340, 360 and the $3^{rd}$ stage string DACs 330, 350. The DSP 390 may generate control signals to control operations of the stages based on the input digital words $D_{INA}$ and $D_{INB}$. The DSP 390 may generate control signals $C_{OA}$-$C_{NA}$ based on the MSBs and LSBs of the digital word $D_{INA}$, may generate control signals $E_{OA}$-$E_{NA}$ based on the MSBs of the digital words $D_{INA}$ and $D_{INB}$ and may generate control signals $D_{OA}$-$D_{MA}$ based on the middle bits of the digital word $D_{INA}$. Further, control signals $C_{OA}$-$C_{NA}$ may control whether the corresponding switch is open or closed in the $2^{nd}$ stage switch network A 340, and control signals $E_{OA}$-$E_{NA}$ may control which impedance state (e.g., high, medium, or low) is selected. Similarly, the DSP 390 may generate control signals $C_{OB}$-$C_{NB}$ based on the MSBs and LSBs of the digital word $D_{INB}$, may generate control signals $E_{OB}$-$E_{NB}$ based on the MSBs of the digital words $D_{INA}$ and $D_{INB}$, and may generate control signals $D_{OB}$-$D_{MB}$ based on the middle bits of the digital word $D_{INB}$. Control signals $C_{OB}$-$C_{NB}$ may control whether the corresponding switch is open or closed in the $2^{nd}$ stage switch network A 340, and control signals $E_{OB}$-$E_{NB}$ may control which impedance state (e.g., high, medium, or low) is selected. In an embodiment, operations of the control signals may be integrated into one set of control signals that control open/closed switch positions as well as impedance state values. Also, control signals $D_{OA}$-$D_{MA}$ and $D_{OB}$-$D_{MB}$ may control whether the corresponding switch is open or closed in the $3^{rd}$ stage string DAC A 330 and the $3^{rd}$ stage string DAC B 350, respectively.

Moreover, the control signals may be inter-dependent as explained in further detail below. For example, $E_{OA}$-$E_{NA}$ and $E_{OB}$-$E_{NB}$ selections may be based on the relationship between input digital words $D_{INA}$ and $D_{INB}$. In particular, the $2^{nd}$ stage switch impedance states may be controlled based on MSB values of the different channels. Hence, the $1^{st}$ stage string 320 may be shared by all channels, and the connections to various nodes in the resistor string therein may be set by the switches in the respective $2^{nd}$ stage switch networks of the different channels. Furthermore, the switches in the $2^{nd}$ stage switch networks may provide different impedance values to compensate for loading effects in multi-channel systems. In addition to channel-to-channel effects, the impedance values may be configured based on other factors such as external inputs. For example, in a System on a Chip (SoC) architecture, the DAC according to embodiments described herein may set $2^{nd}$ stage switch network values based on other factors such as crosstalk variation.

Also, FIG. 3 shows a two channel DAC; however, the FIG. 3 structure may be expanded to any number of channels. Each channel may include its own respective $2^{nd}$ stage switch network and $3^{rd}$ stage string DAC. Moreover, the channels may be implemented so that each has the same resolution. Alternatively, the channels may have different resolutions associated therewith.

FIG. 4 is a simplified circuit schematic of a multi-channel string DAC 400 according to an embodiment of the present invention. For example, the multi-channel string DAC 400 may operate in two channels, channels A and B. The multi-channel string DAC 400 may include a reference voltage $V_{REF}$ 410, a $1^{st}$ stage string 420, a $2^{nd}$ stage switch network A 440, a $3^{rd}$ stage string DAC A 430, a $2^{nd}$ stage switch network B 460, a $3^{rd}$ stage string DAC B 450, and a DSP 490.

The multi-channel string DAC 400 may convert input digital word $D_{INA}$ into a converted analog voltage $V_{OUTA}$ for channel A and may convert input digital word $D_{INB}$ into a converted analog voltage $V_{OUTB}$ for channel B. The channel A and B conversions may be performed in parallel. The $V_{REF}$ 410 may generate a voltage $V_{REF}$ relative to ground. The $V_{REF}$ 410 may be coupled to the $1^{st}$ stage string 420.

The $1^{st}$ stage string 420 may be shared by all channels in the multi-channel string DAC 400. The $1^{st}$ stage string 420 may include resistors R1 421.1-421.N. The resistance of each of the resistors R1 421.1-421.N may be substantially the same (e.g., R1 ohms). The resistors R1 421.1-421.N may operate as a voltage divider network for $V_{REF}$ 410. In an embodiment, the number of resistors N in the $1^{st}$ stage string 420 may be directly related to the resolution (i.e., the number of bits (B)) in the digital word to be converted. In an embodiment, the number of resistors may be provided as $N=2^{B/2}$, where B is the resolution of the $1^{st}$ string 420. For example, for a 4 bit resolution, the $1^{st}$ stage string 420 may include four resistors. In another example, for an 8 bit resolution, the $1^{st}$ stage string 420 may include sixteen resistors. In another embodiment, the number of resistors may be provided as $N=2^{B/2}-1$. Moreover, binary resolution DAC embodiments are described here for illustration purposes, and other numeric bases and non-binary number of states configurations may also be implemented.

The $2^{nd}$ stage switch network A 440 may be unique to channel A. The $2^{nd}$ stage SW switch network A 440 may include switches SW 442.0-442.N. Each switch may have more than two states. The states may include an off position and a plurality of on positions with differing impedance values. In an embodiment, the switches, for example, may include four states—an off position, an on position with high impedance, an on position with medium impedance, and an on position with low impedance. The switches SW 442.0-442.N may be coupled to the ends of the resistors R1 421.1-421.N of the $1^{st}$ stage string 420. The switches may be controlled by control signals $C_{OA}$-$C_{NA}$ and $E_{OA}$-$E_{NA}$, which may be binary control signals. The control signals may be generated by the DSP 490 based on the MSBs and LSBs of the digital word in channel A and the digital word in channel B to be converted. For example, control signals $C_{OA}$-$C_{NA}$ may be based on the MSBs and LSBs of the digital word in channel A, and control signals $E_{OA}$-$E_{NA}$ may be based on the relationship between the digital words in channels A and B. In an embodiment, operations of the control signals may be integrated into one set of control signals that control open/closed switch positions as well as impedance state values.

The $3^{rd}$ stage string DAC A 430 may be unique to channel A. The $3^{rd}$ stage string DAC A 430 may include resistors R2 431.1-431.M and switches SW 432.0-432.M. The resistors R2 431.1-431.M may be serially coupled to each other in combination with the series impedance of the coupled switch network. The resistance of each of the resistors R2 431.1-431.M may be the same (e.g., R2 ohms). In an embodiment, the resistance of each of the resistors R2 431.1-431.M in the $3^{rd}$ stage string DAC A 430 may be greater than the resistance of each of the resistors R1 421.1-421.N in the $1^{st}$ stage string 420 (i.e., R2>R1). The resistors R2 431.1-431.M may operate as a voltage divider network for voltage generated by the previous two stages.

In an embodiment, the number of resistors M in the $3^{rd}$ stage string DAC A 430 may be directly related to the number of resistors in the $1^{st}$ stage string 420. In an embodiment, M=N−1. In another embodiment, the number of resistors M in the $3^{rd}$ stage DAC A 430 may be the same as the number of resistors in the $1^{st}$ stage string 420. Thus, in this embodiment, M=N. Furthermore, other impedance string schemes may be also be used and are in the purview of embodiments of the present invention.

The switches SW 432.0-432.M may be coupled to the ends of the resistors R2 431.1-431.M. The switches may be controlled by control signals $D_{OA}$-$D_{MA}$, which may be binary control signals. The control signals $D_{OA}$-$D_{MA}$ may be generated by the DSP 490 based on the middle bits of the digital word in channel A to be converted. The other ends of the switches SW 432.0-432.M may be coupled to the output, $V_{OUTA}$, of channel A.

The $2^{nd}$ stage switch network B 460 may be unique to channel B. The $2^{nd}$ stage switch network B 460 may include switches SW 462.0-462.N. Each switch may have more than two states. The states may include an off position and a plurality of on positions with differing impedance values. In an embodiment, the switches, for example, may include four states—an off position, an on position with high impedance, an on position with medium impedance, and an on position with low impedance. The switches SW 462.0-462.N may be coupled to the ends of the resistors R1 421.1-421.N of the $1^{st}$ stage string 420. The switches may be controlled by control signals $C_{OB}$-$C_{NB}$ and $E_{OB}$-$E_{NB}$, which may be binary control signals. The control signals may be generated by the DSP 490 based on the MSBs and LSBs of the digital word in channel B to be converted. For example, control signals $C_{OB}$-$C_{NB}$ may be based on the MSBs and LSBs of the digital word in channel B, and control signals $E_{OB}$-$E_{NB}$ may be based on the relationship between the digital words in channels A and B. In an embodiment, operations of the control signals may be integrated into one set of control signals that control open/closed switch positions as well as impedance state values.

The $3^{rd}$ stage string DAC B 450 may be unique to channel B. The $3^{rd}$ stage string DAC B 450 may include resistors R2 451.1-451.M and switches SW 452.0-452.M. The resistors R2 451.1-451.M may be serially coupled to each other in combination with the series impedance of the switch network. The resistance of each of the resistors R2 451.1-451.M may be the same (e.g., R2 ohms). In an embodiment, the resistance of each of the resistors R2 451.1-451.M in the $3^{rd}$ stage string DAC B 450 may be greater than the resistance of each of the resistors R1 421.1-421.N in the $1^{st}$ stage string 420 (i.e., R2>R1). The resistors R2 451.1-451.M may operate as a voltage divider network for voltage generated by the previous two stages.

The switches SW 452.0-452.M may be coupled to the ends of the resistors R2 451.1-451.M. The switches may be controlled by control signals $D_{OB}$-$D_{MB}$, which may be binary control signals. The control signals $D_{OB}$-$D_{MB}$ may be generated by the DSP 490 based on the middle bits of the digital word in channel B to be converted. The other ends of the switches SW 452.0-452.M may be coupled to the output, $V_{OUTB}$, of channel B.

DSP 490 may receive the digital words for each channel and may generate corresponding control signals. The control signals for the channels may also be inter-dependent on other channel data. For example, control signals $E_0$-$E_N$ for the channels may be dependent on the relationship between the digital words for channel A and channel B.

In an embodiment, the number of resistors M in the $3^{rd}$ stage string DAC B 450 may be directly related to the number of resistors in the $1^{st}$ stage string 420 (i.e., M=N−1). In another embodiment, the number of resistors M in the $3^{rd}$ stage DAC A 430 may be the same as the number of resistors in the $1^{st}$ stage string 420 (i.e., M=N). Moreover, the number of resistors in each string may be varied based on DAC applications.

Figure 5A:
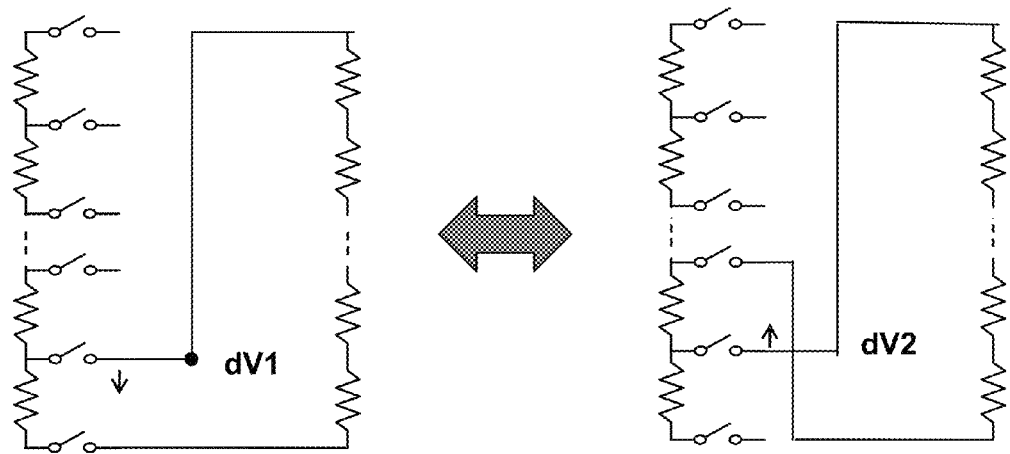
FIG. 5(a) illustrates LSB DAC loading effects in a two-state transition DAC configuration.
Figure 5B:
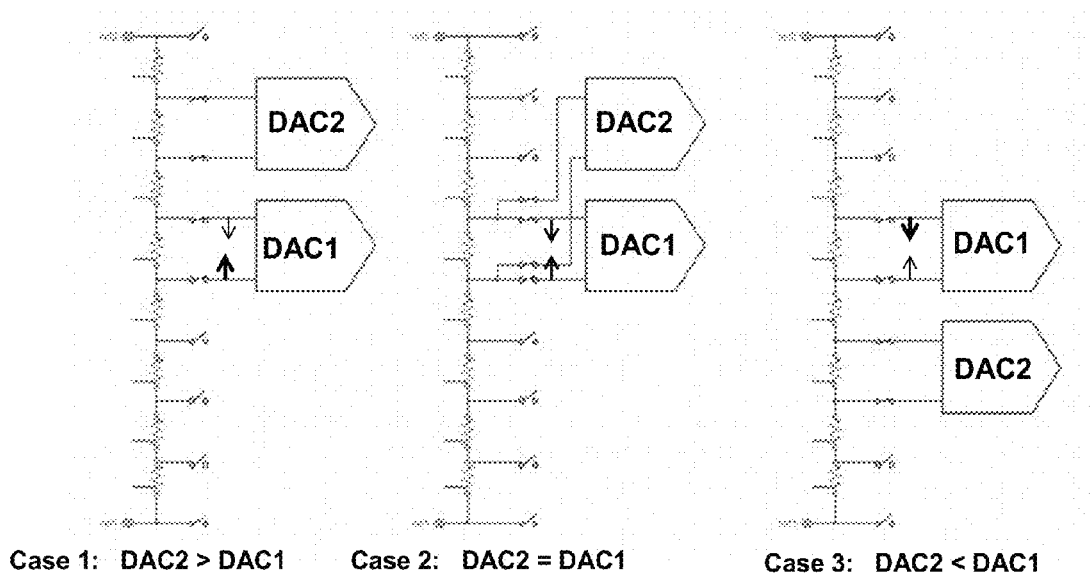
FIG. 5(b) illustrates 'on' conditions for a string DAC configuration according to an embodiment of the present invention.

String DACs described herein may also include different "transition" configurations, which refer to transitions from previous/current (i.e., old) code to new code connections. "Transition" may refer to DC states of the DAC during transition from old code to new code for serially coupled MSB impedance elements. For example, in an embodiment, string DAC transition configuration may include two transition states. The two transition state configuration may be implemented as taught in U.S. Pat. No. 5,969,657. FIG. 5(*a*) illustrates a two transition state configuration. Here, the string DAC may transition from an old code connection (dv1) directly to a new code connection (dv2). In an embodiment, for a two transition state configuration, the switches in $2^{nd}$ stage switch networks described herein (e.g., $2^{nd}$ stage switch network 240 in FIG. 2) for a two channel system may have four states—three on conditions and one off condition. FIG. 5(*b*) illustrates the three on conditions, which may include DAC2>DAC1, DAC2=DAC1, and DAC2<DAC1, where DAC1 and DAC2 are $1^{st}$ stage string configurations of the respective channels (i.e., DAC1 is the $1^{st}$ stage resistor string connection for channel A and DAC2 is the $1^{st}$ stage resistor string connection for channel B) for a two DAC channel embodiment, and DAC1 and DAC2 are only part of the separate DAC channels.

Table 1 illustrates a truth table of different setting modes for the $2^{nd}$ stage switch networks (for channels A and B) based on the relationship of the $1^{st}$ stage string configurations, DAC2 and DAC1.

TABLE 1

| CASE | RELATIVE POSITION | DAC 1 UPPER SWITCH | DAC 1 LOWER SWITCH |
|------|------|------|------|
| 1 | DAC2 > DAC1 | HIGH IMPEDANCE | LOW IMPEDANCE |
| 2 | DAC2 = DAC1 | MID IMPEDANCE | MID IMPEDANCE |
| 3 | DAC2 < DAC1 | LOW IMPEDANCE | HIGH IMPEDANCE |

Impedance values of the DAC switches may compensate for the loading effects on the particular DAC. For example, in Case 1, the lower branch of DAC1 is being pulled high by both DAC1 and DAC2, and therefore a low impedance $2^{nd}$ stage switch network impedance may compensate for being pulled high. In the same example of Case 1, the upper branch of DAC1 is being pulled low by DAC1 and up by DAC2, and therefore a high $2^{nd}$ stage switch network impedance may compensate for the sum of opposing forces. The MSB switches may have the opposite configuration in Case 3 as compared to Case 1. In Case 2, since both DAC1 and DAC2 are tied in parallel, mid $2^{nd}$ stage switch network impedance values may compensate for any substantial loading effects. In an embodiment, DAC1 and DAC2 may have substantially the same resolution and present the same load. Alternatively, DAC1 and DAC2 may differ in resolution and thus may present different loads. The switch impedance values may also compensate for these different loads.

In another embodiment, string DAC transition configuration may include three transition states. The three transition state configuration may be implemented as taught in U.S. Pat. No. 7,136,002. FIG. 6 illustrates a three transition state configuration. Here, the string DAC may transition from an old code connection (dv1) to an intermediate connection (Unloaded) and then to a new code connection (dv2). The intermediate state may be classified as an un-loaded state because only one or no nodes (as opposed to two nodes) may be connected to the resistor string. Hence, current path may be cut off. For a three transition state DAC configuration in a two channel system, the mid-stage switch network may have at least four on-conditions and one off-condition. Three transition state DAC configuration may lead to a higher number of 'on' conditions as compared to a two transition state DAC configuration. Thus, a more complex MSB multiplexer may be implemented for a three-state DAC configuration implementation. For example, the number of states in a three transition state DAC configuration may be expressed as $2^{N1}*2^{N2}=2^{(N1+N2)}$, where N1 and N2 refer to resolutions of the converters (DACs). However, the different states may be grouped together as similar states in terms of channel-channel interaction. For example, FIG. 5(b) also may illustrate three grouping of states.

Returning to the two-phase configuration embodiment, the number of switch states per node may be related to the number of channels in the multi-channel system. In an embodiment, the number of 'on' states—($N_{SW\_on}$) may be expressed as:

$$N_{SW\_on}=2+(N_{CH}-1)*(N_{CH}/2),$$

where is $N_{CH}$ is the number of channels in the system. Hence, in a two channel system, three on-switch states may be used per $2^{nd}$ switching network. In a four channel system, eight on-switch states may be used, and in an eight channel system, thirty on-switch states may be needed. Therefore, a tradeoff between performance and the number of switch states may exist as the number of channels increase in the system. Of course, the number of switch states (or group of switch states) ($N_{SW}$) may have an additional state for an off state and may be expressed as:

$$N_{SW}=3+(N_{CH}-1)*(N_{CH}/2),$$

where is $N_{CH}$ the number of channels in the system.

Figure 7:
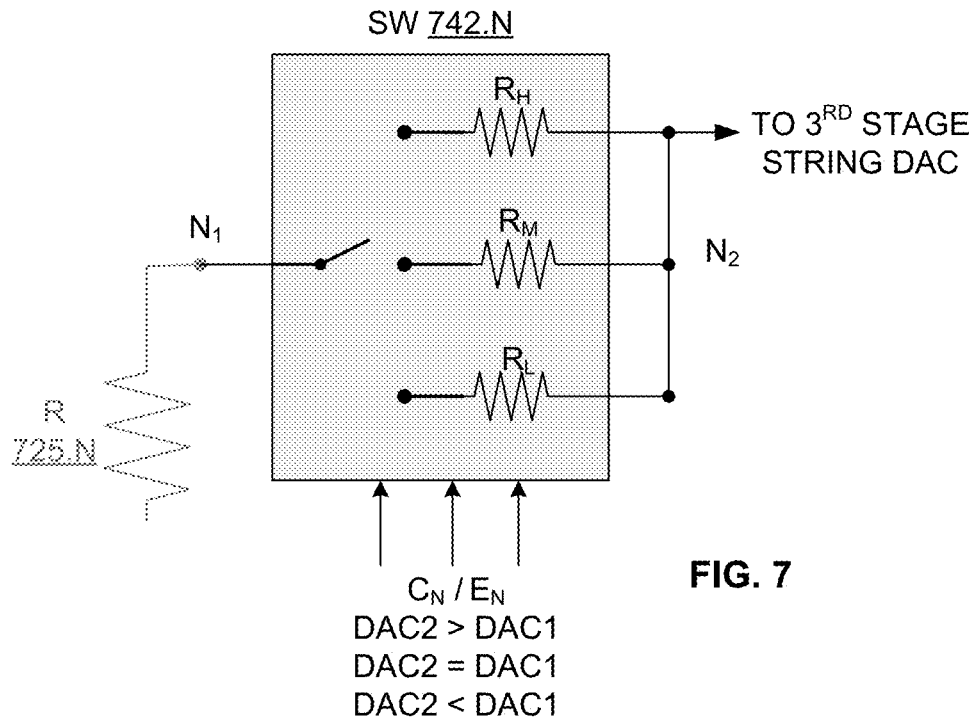
FIG. 7 illustrates a functional multi-state switch diagram according to an embodiment of the present invention.

FIG. 7 is a simplified functional diagram of a switch according to an embodiment of the present invention that may be implemented in a $2^{nd}$ stage switch network in the embodiments described herein. Switch 742.N may be coupled to a node $N_1$ in the $1^{st}$ stage string (say, resistor 725.N). The switch 742.N may be operated according to $C_N$ and $E_N$, which correspond to the MSB and LSB positions of the digital word in the respective channel that switch 742.N is located in. The output of the switch, $N_2$ may be one of the terminals of the $3^{rd}$ stage string DAC in the same channel path. The switch 742.N may include four states that are controlled based on the relationship of the $1^{st}$ stage string DAC usage of the multiple channels. For example, the different configurations of the $1^{st}$ stage string DAC may include DAC2>DAC1, DAC2=DAC1, and DAC2<DAC1, where DAC1 and DAC2 are $1^{st}$ stage string configurations (i.e., MSB DAC values) of the respective channels. Hence, the switch states may include: off position, on position with high impedance ($R_H$), on position with medium impedance ($R_M$), and on position with low impedance ($R_L$). In an embodiment, $C_N$ may control the on/off position of the switch, and $E_N$ may control the impedance state of the switch (e.g., high, medium, or low). In a three transition state configuration embodiment, the loading effects and interaction between the channels may also depend on the LSB states of the different channels.

In an embodiment, the switch states may be provided with separate switches. While separate independent switches and resistors may be provided for each target resistance, it will be appreciated by those skilled in the art that a lower number of switches may be used to achieve the desired resistance values using parallel combinations selected via digital control for better area and analog performance.

Figure 8:
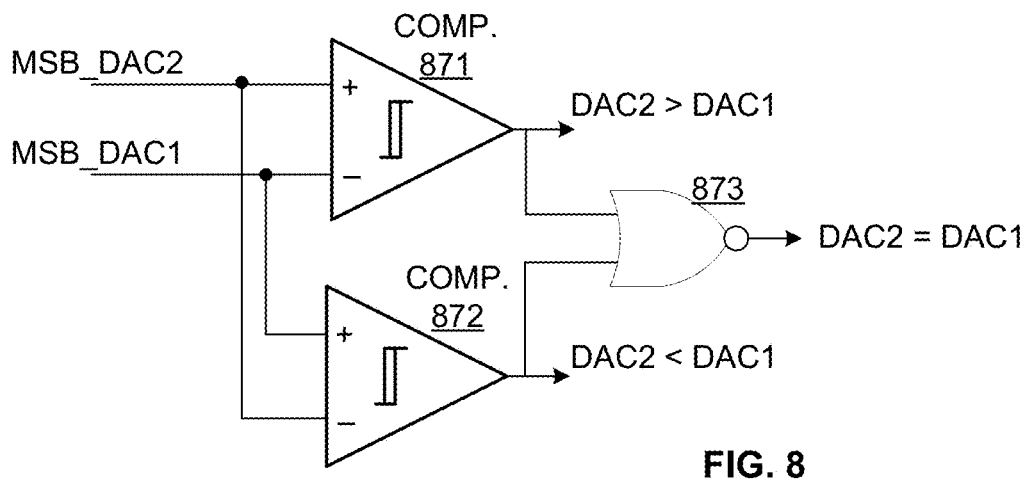
FIG. 8 illustrates a control signal generation system according to an embodiment of the present invention.

FIG. 8 is a simplified block diagram of a control signal generation system 800 according to an embodiment of the present invention. The system 800 may be implemented digitally in a DSP as described herein. The system 800 may include comparators 871, 872 and a NOR gate 873. The comparator 871 may receive the DAC value of the MSB configurations of the two channels, MSB_DAC1 and MSB_DAC2. The MSB_DAC2 may be coupled to the non-inverting input, and the MSB_DAC1 may be coupled to the inverting input. The output of comparator 871 may indicate whether DAC2>DAC1. In an embodiment, the comparator 871 may be implemented by a subtractor. The comparator 872 may receive the DAC value of the MSB configurations of the two channels, MSB_DAC1 and MSB_DAC2. The MSB_DAC2 may be coupled to the inverting input, and the MSB_DAC1 may be coupled to the non-inverting input. The output of comparator 871 may indicate whether DAC2<DAC1. In an embodiment, the comparator 872 may be implemented by a subtractor The NOR gate 873 inputs may be coupled to the outputs of the comparators 871, 572, and the NOR gate 873 output may indicate whether DAC2=DAC1. FIG. 8 is an exemplary implementation for illustration purposes and other implementations are within the scope of the present invention. For example, the implementation may be based on the cell library, design synthesis tools, constraints, etc., as is known to those skilled in the art. Of course, the comparators 871, 872 and NOR gate 873 and their operations may be implemented digitally.

Figure 9:
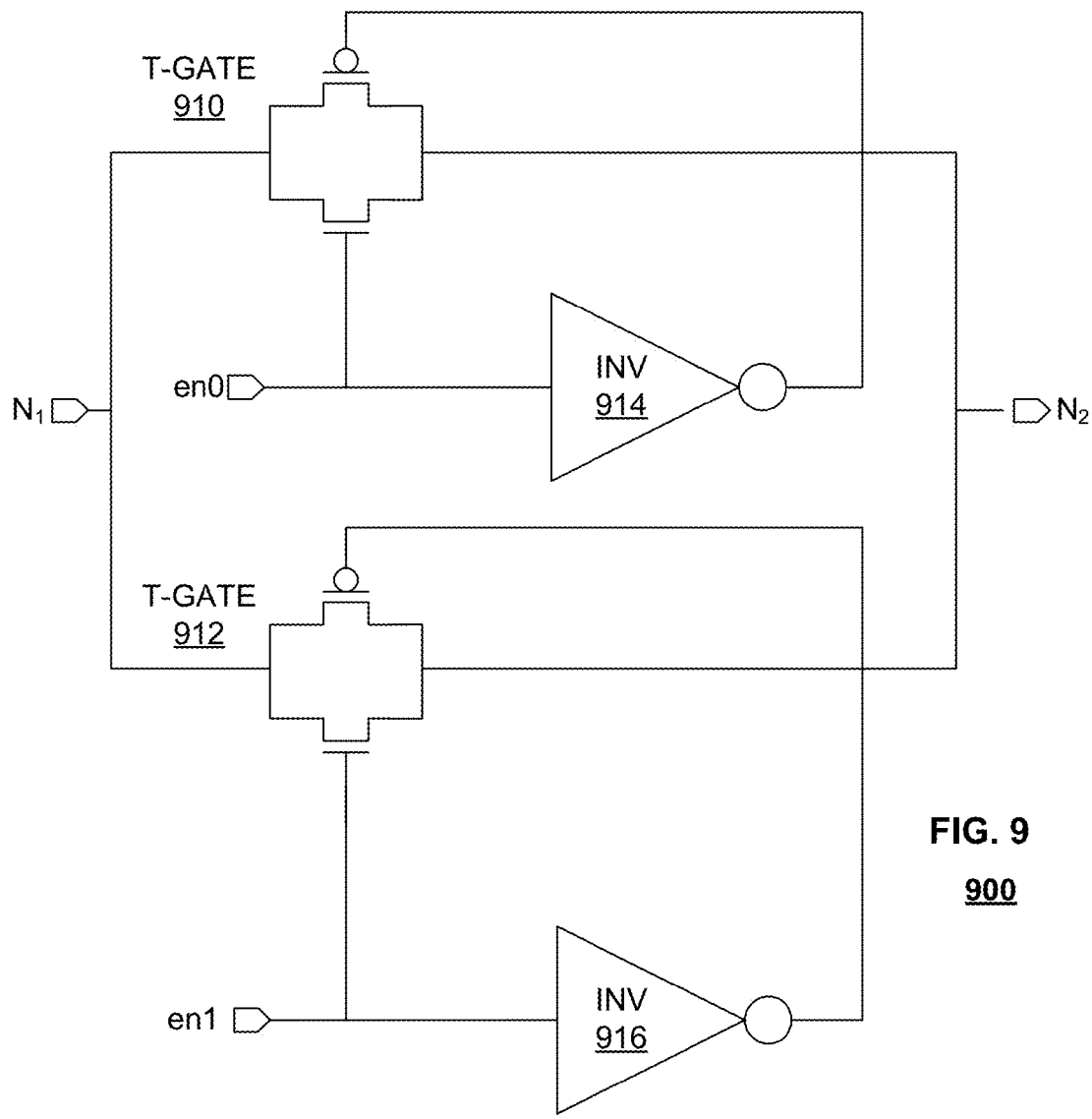
FIG. 9 illustrates a circuit implementation of a multi-state switch according to an embodiment of the present invention.

FIG. 9 is a circuit diagram of a CMOS transmission gate (T-Gate) based switch 900 according to an embodiment of the present invention, which may be implemented in a $2^{nd}$ stage switch network in the embodiments described herein. The switch 900 may include T-Gates 910, 912 and two inverters 914, 916. The T-Gate 910 input may be coupled to the switch input, $N_1$, and the T-Gate 910 output may be coupled to the switch output, $N_2$. The T-Gate 910 may include complementary CMOS transmission gates. For example, the T-Gate 910 may include a PMOS transistor in parallel with a NMOS transistor. The T-Gate 912 input may be coupled to the switch input, $N_1$, and the T-Gate 912 output may be coupled to the switch output, $N_2$. The T-Gate 912 may include complementary CMOS transmission gates. For example, the T-Gate 912 may include a PMOS transistor in parallel with a NMOS transistor. The inverters 914, 916 inputs may be coupled to enable signals, en0 and en1. The T-Gate 910 operations may be controlled by the en0 and en1, and by the inverted en0 and en1. The switch 900 may provide three impedance values (states). A first impedance value may be provided with T-gate 910 operating. A second impedance value may be provided with T-gate 920 operating. And a third impedance value may be provided with T-Gates 910 and 920 operating in parallel.

Figure 10:
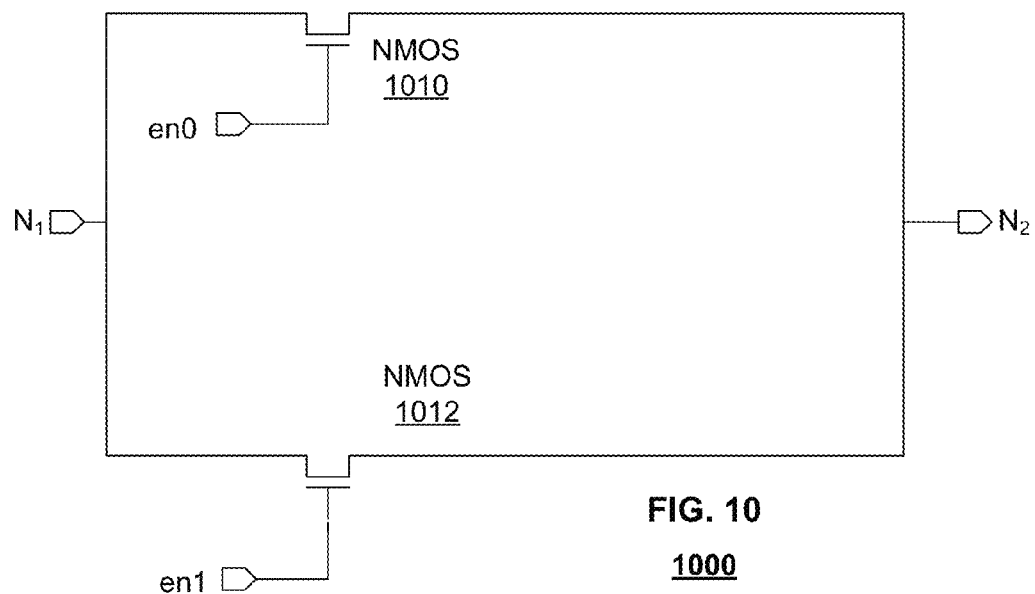
FIG. 10 illustrates a circuit implementation of a multi-state switch according to an embodiment of the present invention.

FIG. 10 is a circuit diagram of a NMOS based switch 1000 according to an embodiment of the present invention, which may be implemented in a $2^{nd}$ stage switch network in the embodiments described herein. The switch 1000 may include NMOS transistors 1010, 1012. The NMOS transistor 1010 input may be coupled to the switch input, $N_1$, and the NMOS transistor 1010 output may be coupled to the switch output, $N_2$. The gate of the NMOS transistor 1010 may be controlled by enable signal en0. The NMOS transistor 1012 input may be coupled to the switch input, $N_1$, and the NMOS transistor 1012 output may be coupled to the switch output, $N_2$. The gate of the NMOS transistor 1012 may be controlled by enable signal en1. The switch 1000 may provide three impedance values (states). A first impedance value may be provided with NMOS transistor 1010 operating. A second impedance value may be provided with NMOS transistor 1012 operating. And a third impedance value may be provided with NMOS transistors 1010 and 1012 operating in parallel. In another embodiment, switch 1000 may be implemented using PMOS transistors. FIG. 9 and FIG. 10 illustrate exemplary MOS and T-Gate switch implementations; however, other variants of switch designs may be used.

Figure 11:
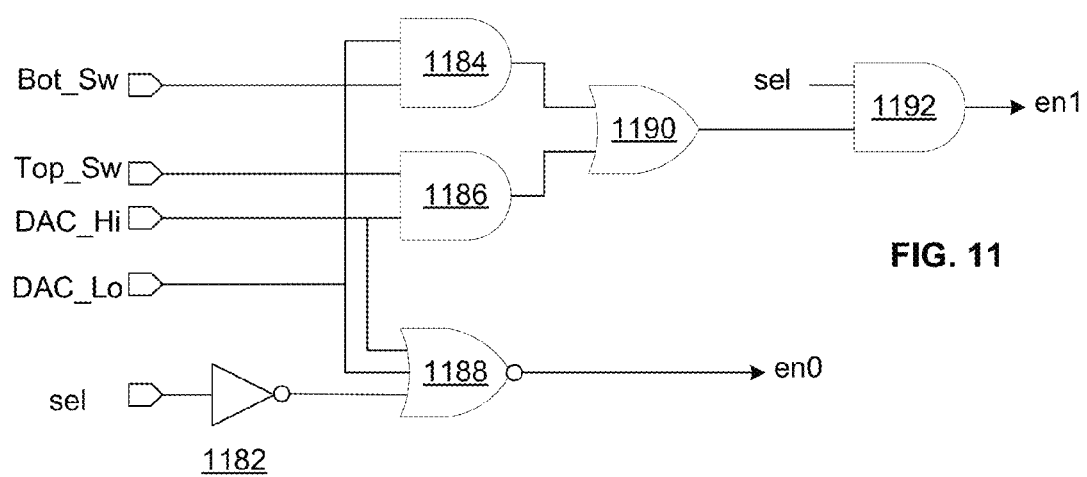
FIG. 11 illustrates a Boolean switch control according to an embodiment of the present invention.

FIG. 11 is a simplified block diagram of a Boolean control of the switches in a two channel string DAC according to an embodiment of the present invention. In an embodiment, the Boolean control may generate the enable signals en0 and en1 of FIG. 9, FIG. 10, or other switch implementations in a $2^{nd}$ stage switch network as described in the embodiments herein. The Boolean control may include an inverter 1182; AND gates 1184, 1186, 1192; a NOR gate 1188; and an OR gate 1190. FIG. 11 illustrates an exemplary implementation; however, other implementations may also be used.

Several embodiments of the invention are specifically illustrated and/or described herein. However, it will be appreciated that modifications and variations of the invention are covered by the above teachings and within the purview of the appended claims without departing from the spirit and intended scope of the invention.

In other instances, well-known operations, components and circuits have not been described in detail so as not to obscure the embodiments. For example, two terminal resistors described herein are for description simplicity; however, two terminal resistors described herein may be generalized as impedance elements as is known to those skilled in the art. For example, three terminal impedance elements such as backplate elements or three terminal resistors may also be used and are not described here in detail so as not to obscure the embodiments. It can be appreciated that the specific structural and functional details disclosed herein may be representative and do not necessarily limit the scope of the embodiments. For example, track impedances may be implemented in the embodiments described herein. Moreover, embodiments of the present invention are described herein using resistor strings for illustration purposes; however, embodiments of the present invention may be implemented with other impedance string schemes. For example, MOS structures biased in un-saturated operations may be utilized in impedance string schemes.

We claim:

1. A string digital-to-analog converter (DAC), comprising:
a first impedance string including a plurality of N impedance elements forming N+1 nodes;
a switch network coupled to the first impedance string including N+1 switches where each switch selectively connects a unique node of the first impedance string to an input of a second impedance string with each switch having a single input, a single output, and having more than two states including an off state and multiple on states with different switch impedances.

2. The string DAC of claim 1, wherein the on states include three different on states that have three different on impedance values.

3. The string DAC of claim 1, further comprises:
a second switch network coupled to the first impedance string, wherein at least one switch in the second switch network having more than two states; and
a third impedance string coupled to the second switch network.

4. The string DAC of claim 3, further comprises a controller coupled to the first and second switch network to control the switches therein based on two input digital words to be converted.

5. The string DAC of claim 4, wherein the controller has an input for external factors.

6. The string DAC of claim 1, wherein the first impedance string, the switch network, and the second impedance string each have a unique resolution, and the resolution of the string DAC is the sum of the resolutions of the first impedance string, the switch network, and the second impedance string.

7. The string DAC of claim 1, wherein the switch network switch includes a CMOS transmission gate switch.

8. The string DAC of claim 1, wherein the switch network switch includes a NMOS switch.

9. The string DAC of claim 1, wherein the switch network switch includes a PMOS switch.

10. The string DAC of claim 1, wherein the first and second impedance strings each include a respective resistor string.

11. The string DAC of claim 1, wherein the first and second impedance strings each include MOS impedance elements.

12. The string DAC of claim 1, further comprises another switch network coupled to the second impedance string to provide an output.

13. A multi-channel string DAC, comprising:
a first string corresponding to respective first portions of a plurality of digital words;
a plurality of switch networks, each switch network associated with a respective channel and coupled to the first string, wherein at least one switch in each switch network has more than two states; and
a plurality of channel strings, each channel string is coupled to a respective switch network and including an output terminal to output a converted analog signal for the respective channel, wherein the first string is shared by the plurality of channel strings to output the converted analog signal for each channel, wherein each channel corresponds to a separate digital word of the plurality of digital words.

14. The multi-channel string DAC of claim 13, further comprises a controller to control the plurality of switch networks based on the digital words for each channel.

15. The multi-channel string DAC of claim 13, wherein the controller includes an input for an external factor and the plurality of switch network control is further adjusted based on the external factor.

16. The multi-channel string DAC of claim 13, wherein the state of the at least one switch is set based on a comparison of MSBs of different channels.

17. The multi-channel string DAC of claim 13, wherein the number of groups of switch states (NSW) per channel is expressed as:

$$N_{SW}=3+(N_{CH}-1)*(N_{CH}/2),$$

where $N_{CH}$ is the number of channels in the multi-channel string DAC and the number of switch states includes an off state.

18. The multi-channel string DAC of claim 13, wherein the first string is a resistor string.

19. The multi-channel string DAC of claim 13, wherein a plurality of switches in each switch network have more than two states.

20. A method of converting multiple digital words into respective analog voltages in separate channels, comprising:
receiving the multiple digital words;
applying a reference voltage to a shared string;
coupling multiple sets of switches to different nodes in the shared string based on first portions of the multiple digital words;
configuring impedance values of the coupled switches based on a relationship between the first portions of the multiple digital words;
coupling outputs of the multiple sets of switches to channel strings; and
outputting the respective analog voltages for each channel, wherein the shared string is shared by the channel strings to output the analog voltages for each channel, and wherein each channel corresponds to a separate digital word of the multiple digital words.

21. The method of claim 20, wherein the first portions correspond to the most significant bits (MSBs) of the multiple digital words.

22. The method of claim 21, further comprises controlling a plurality of second channel set of switches, each set coupled to a respective channel string, based on middle bits of the digital word corresponding to the respective channel, wherein the middle bits are bits between the MSBs and least significant bits (LSBs) of the digital word.

23. The method of claim 21, wherein the coupling of multiple sets of switches is also based on LSBs of the digital words.

24. The method of claim 20, wherein a minimum number of impedance values (NSW) per channel is expressed as:

$$N_{SW}=3+(N_{CH}-1)*(N_{CH}/2),$$

where $N_{CH}$ is the number of channels and the number of impedance values includes an off state.

25. A multi-channel digital to analog converter (DAC), comprising:
a first stage resistor string;
a plurality of second stage resistor strings, each associated with a respective channel; and
a plurality of switch networks, each having switches to connect intermediate nodes of the first stage resistor string to end points of a respective second stage resistor string,
wherein switches of the switch networks have multiple conductive states, wherein the first stage resistor string is shared by the plurality of second stage resistor strings to output converted analog signals for each channel, and wherein each channel corresponds to a separate digital word.

26. The multi-channel DAC of claim 25, further comprises a controller to control the plurality of switch networks based on the digital words for each channel.

27. The multi-channel DAC of claim 25, wherein the state of the at least one switch is set based on a comparison of MSBs of different channels.

28. The multi-channel DAC of claim 25, wherein a minimum number of conductive states (NSW_ON) is expressed as:

$$N_{SW\_ON}=2+(N_{CH}-1)*(N_{CH}/2),$$

where $N_{CH}$ is the number of channels in the multi-channel DAC.

* * * * *